United States Patent [19]

Takehara

[11] Patent Number: 5,262,001
[45] Date of Patent: Nov. 16, 1993

[54] DRY ETCHING METHOD FOR PEROVSKITE OXIDE FILM

[75] Inventor: Daisuke Takehara, Ikoma, Japan

[73] Assignee: Sharp Kabushiki Kaisha, Osaka, Japan

[21] Appl. No.: 945,901

[22] Filed: Sep. 17, 1992

[30] Foreign Application Priority Data

Oct. 8, 1991 [JP] Japan .................. 3-260822

[51] Int. Cl.$^5$ ................ B44C 1/22; C03C 15/00; C03C 25/06; C23F 1/00
[52] U.S. Cl. ................... 156/643; 156/635; 156/667; 252/79.1
[58] Field of Search ........ 156/635, 643, 646, 654–656, 156/659.1, 663, 667, 662, 345; 204/192.32, 192.35, 298.37, 298.38; 252/79.1

[56] References Cited

U.S. PATENT DOCUMENTS

| | | | |
|---|---|---|---|
| 4,759,823 | 7/1988 | Asselanis et al. | 156/659.1 |
| 5,034,086 | 7/1991 | Sato | 156/345 |
| 5,194,119 | 3/1993 | Iwano et al. | 156/643 |

Primary Examiner—William A. Powell
Attorney, Agent, or Firm—Nixon & Vanderhye

[57] ABSTRACT

A dry etching method for perovskite oxide film includes introduction of a hydrogen gas and an acetylacetone- or n-butyl acetate gas into an electron cyclotron resonance plasma etching system simultaneously so as to etch a perovskite oxide film.

4 Claims, 1 Drawing Sheet

5,262,001

DRY ETCHING METHOD FOR PEROVSKITE OXIDE FILM

FIELD OF THE INVENTION

The present invention relates to a dry etching method for perovskite oxide film, and in more particular to such method utilizing reactive ion etching.

DESCRIPTION OF THE RELATED ART

Perovskite oxides, for example PZT (Pb-Zr-TiO$_3$), are of perovskite structure represented by ABO$_3$ and have a hysteresis property that polarization occurs therein by applying thereto an electric field from exterior and is maintained even after application of the electric field stops. In addition they have a high dielectric constant. For this reason perovskite oxides are earnestly expected to develop in various applications such as for capacitor insulator in large-capacity DRAMs, dielectric material for nonvolatile memory and the like.

Conventionally, dry etching for PZT films has been carried out by sputtering with use of an ion milling system wherein positive ions are produced by causing an electric discharge in an ion source under an inert gas such as of argon at 10 Torr, then accelerated and made to impinge on a sample to etch the same. With such method, however, it is extremely difficult to realize fine etching to PZT films because there is substantially no etching selectivity between the PZT films and photoresists.

SUMMARY OF THE INVENTION

The present invention has been achieved in view of the above-noted problem, and a primary object thereof is to provide a dry etching method adapted to fine etch perovskite oxide films such a PZT and PLZT films.

Thus, the present invention provides a dry etching method for perovskite oxide film, comprising introducing hydrogen gas and acetylacetone gas or n-butyl acetate gas into an electron cyclotron resonance plasma etching system simultaneously so as to etch a perovskite oxide film.

DETAILED DESCRIPTION OF THE PREFERRED EMBODIMENTS

Figure 1:
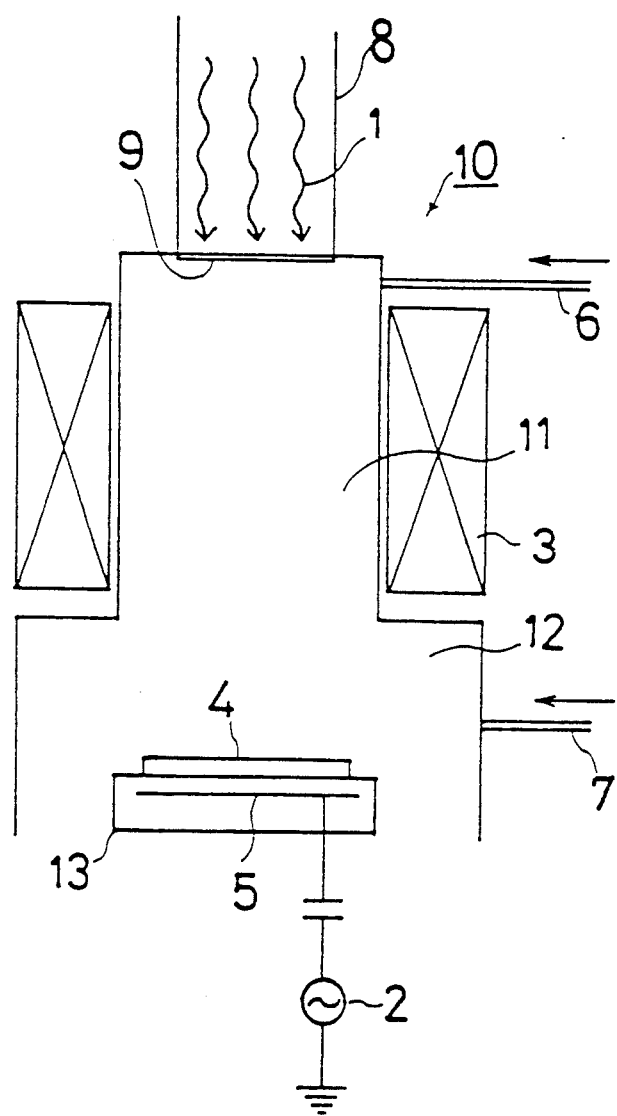
FIG. 1 is a schematic representation showing the configuration of an electron cyclotron resonance plasma etching system as used in an embodiment of the invention.

The present invention is applicable to etching for any perovskite oxide, for example, PZT (Pb-Zr-TiO$_3$), PLZT (Pb-La-Zn-TiO$_3$) or the like.

The electron cyclotron resonance plasma etching system, to be called "ECR system" hereinbelow, as used in the invention may be an ECR system as exemplified in FIG. 1. The ECR system comprises a plasma generating chamber 11, a sample chamber 12 connected to a lower part of the plasma generating chamber 11, a microwave guide tube 8 connected to a top part of the chamber 11 for introducing microwave thereinto, a solenoid coil 3 concentric with and winding around the chamber 11, and a sample holder 13 disposed within the sample chamber 12. The plasma generating chamber 11 is shaped substantially cylindrical and connected at an upper part thereof with a first gas conduit 6. The sample chamber 12, having a diameter larger than that of the plasma generating chamber 11, is connected at a side wall thereof with a second gas conduit 7. Within the sample chamber 12 and at the center of a lower part thereof is disposed the sample holder 13 having an electrode 5 therein, on which a sample 4 is placed. The electrode 5 in the sample holder 13 is connected to a high-frequency power source 5.

In the present invention hydrogen gas is introduced into the ECR system, then excited to produce hydrogen ions which are in turn applied to a sample of perovskite oxide film such as PZT or PLZT film, while at the same time acetylacetone gas is introduced thereinto and led to the sample, whereby the acetylacetone gas forms complexes with the components of the perovskite oxide film, for example, Pb, Zr, Ti and/or La of the PZT or PLZT film and such complexes then evaporate naturally. This leads to realization of fine etching to the perovskite oxide film.

Alternatively, the present invention can be effected by using n-butyl acetate gas instead of acetylacetone gas with other conditions for the above case not changed.

The pressure within the ECR system is preferably set to about $5 \times 10^{-3}$ Torr; the flow rate of hydrogen gas preferably ranges from about 5 to about 20 SCCM; and the flow rate of acetylacetone gas or n-butyl acetate gas preferably ranges from about 10 to 100 SCCM.

Described below are examples of the dry etching method of the present invention using the above-mentioned ECR system 10.

Hydrogen gas is introduced into the plasma generating chamber 8 of the ECR system 10 through the first gas conduit 6, while microwave 1 of 2.45 GHz is introduced thereinto through the microwave guide tube 8 to excite the introduced hydrogen gas. The excited hydrogen gas becomes hydrogen ions which are then led to the surface of a sample 4 (PZT film) placed within the sample chamber 12 by means of a magnetic field produced with the solenoid coil 3, the sample being applied with high frequency of 13.56 MHz through the electrode 5. On the other hand, acetylacetone gas is introduced into the sample chamber 12 and led to the vicinity of the sample 4. Acetylacetone of the gas is adsorbed by the surface of the sample 4 and hydrogen ions collide with the adsorbed acetylacetone. The energy obtained from the collision causes the adsorbed acetylacetone to form complexes with the components of the PZT film, or Pb, Zr and Ti. Such complexes evaporate as a matter of course, with the result that reactive ion etching is achieved. Thus, very fine etching to the PZT film is realized.

In another example, n-butyl acetate gas is used instead of acetylacetone gas with other conditions not changed. This example also assures fine etching as in the former example.

As has been described, the dry etching method according to the present invention enables to realize very fine etching for perovskite oxide films, and can hence be applied to fabrication of various semiconductor devices such as VSLIs, large-capacity DRAMs, nonvolatile memory devices and the like.

While only certain presently preferred embodiments have been described in detail, as will be apparent with those familiar with the art, certain changes and modifications can be made without departing from the scope of the invention as defined by the following claims.

What we claim is:

1. A dry etching method for perovskite oxide film, comprising introducing hydrogen gas and acetylacetone gas or n-butyl acetate gas into an electron cyclotron resonance plasma etching system simultaneously so as to etch a perovskite oxide film.

2. A method as set forth in claim 1, wherein said perovskite oxide film includes a Pb-Zr-TiO$_3$ film and a Pb-La-Zn-TiO$_3$ film.

3. A method as set forth in claim 1, wherein the hydrogen gas is introduced into said electron cyclotron resonance plasma etching system at a flow rate of from 5 to 20 SCCM.

4. A method as set forth in claim 1, wherein the acetylacetone gas or n-butyl acetate gas is introduced into said electron cyclotron resonance plasma etching system at a flow rate of from 10 to 100 SCCM.

* * * * *